(12) United States Patent
Ziger et al.

(10) Patent No.: US 6,372,658 B1
(45) Date of Patent: Apr. 16, 2002

(54) REDUCING CONTAMINATION INDUCED SCUMMING, FOR SEMICONDUCTOR DEVICE, BY ASHING

(75) Inventors: David Ziger; Christopher Robinett, both of San Antonio; Ramiro Solis, Bandera, all of TX (US)

(73) Assignee: Koninklijke Philips Electronics N.V. (KPENV), Eindhoven (NL)

( * ) Notice: Subject to any disclaimer, the term of this patent is extended or adjusted under 35 U.S.C. 154(b) by 0 days.

(21) Appl. No.: 09/157,899

(22) Filed: Sep. 21, 1998

(51) Int. Cl.[7] .......................... H01L 21/302; G03F 7/26
(52) U.S. Cl. .................. 438/725; 430/291; 430/313
(58) Field of Search ..................... 438/725; 430/291, 430/313

(56) References Cited

U.S. PATENT DOCUMENTS

| | | | | |
|---|---|---|---|---|
| 5,201,960 A | * | 4/1993 | Starov | 134/11 |
| 5,429,910 A | * | 7/1995 | Hanawa | 430/313 |
| 5,792,590 A | * | 8/1998 | Hirasawa | 430/296 |
| 5,968,374 A | * | 10/1999 | Bullock | 438/725 |
| 6,096,484 A | * | 8/2000 | Azuma | 430/325 |
| 6,309,804 B1 | * | 10/2001 | Ziger | 430/322 |

OTHER PUBLICATIONS

Wolf et al. "Silicon Processing for the VLSI Era" vol. 1, Lattice Press, 1986, p. 427–429.*
VLSI.204PA entilted "Reducing Contamination Induced Scumming, for Semiconductor Device, by Improved Covercoating" Ser.No. 09/157900.

* cited by examiner

*Primary Examiner*—Olik Chaudhuri
*Assistant Examiner*—Anh Duy Mai

(57) ABSTRACT

A semiconductor device is manufactured using an ashing process to eliminate the adverse effects of contamination, such as amine-airborne contamination. Consistent with one embodiment of the present invention, the semiconductor device is formed by applying a DUV-type photoresist over the wafer surface, exposing the photoresist to DUV light, baking the wafer, and then ashing the wafer in a highly-oxidized environment to remove insoluble amine-related resist.

6 Claims, 4 Drawing Sheets

Exposed Resist — 60

Contamination — 64

After PEB

After Ashing

After Develop

REDUCING CONTAMINATION INDUCED SCUMMING, FOR SEMICONDUCTOR DEVICE, BY ASHING

FIELD OF THE INVENTION

The present invention is directed generally to a semiconductor method of manufacture. More particularly, the invention relates to such a method involving the reduction or elimination of the adverse effects of contaminants, such as amine airborne-contaminants, which adversely affect types of resists used for photolithography masking.

BACKGROUND OF THE INVENTION

The electronics industry continues to strive for high-powered, high-functioning circuits. Significant achievements in this regard have been realized through the fabrication of very large-scale integration of circuits on small areas of a silicon wafer. Integrated circuits of this type are manufactured through a series of steps carried out in a particular order. The main objective in manufacturing such devices is to obtain a device which conforms to geographical features of a particular design for the device. To obtain this objective, steps in the manufacturing process are closely controlled to insure that rigid requirements, for example, exacting tolerances, quality materials, and clean environment, are realized.

Semiconductor devices are used in large numbers to construct most modern electronic devices. In order to increase the capability of such electronic devices, it is necessary to integrate even larger numbers of such devices into a single silicon wafer. As the semiconductor devices are scaled down (i.e., made smaller) to form a larger number of devices on a given surface area, the structure of the devices and fabrication techniques used to make such devices must be refined to remove contaminants and structural imperfections.

A wide variety of processing techniques may be employed in manufacturing silicon integrated circuit devices. In those devices, silicon is employed as a semiconductor for conduction of electricity. The chip manufacturing process typically begins with a silicon wafer workpiece. The silicon wafer workpiece is formed of single-crystal silicon (Si). Single-crystal silicon is required because optimization of the final product device depends upon the conformance of the device through each fabrication step to particular geographical arrangements.

Typical steps in the manufacturing process of a silicon integrated circuit device begin with transferring a desired pattern to the surface of a silicon wafer. This pattern may be formed on the wafer surface in a variety of manners. Various materials are formed on the wafer surface in uniform layers or in particular patterns, as desired. A variety of techniques, including, for example, photolithography, may be employed to achieve desired wafer surface configurations.

In photolithography, a photoresist material, for example, a photo-sensitive polymer, may be layered over a somewhat uniform silicon dioxide layer on a wafer surface. A mask having a desired design of clear and opaque areas may then be positioned atop the photoresist layer. Photoresist will selectively respond to UV light. As a result of this selective response characteristic of photoresist, the photoresist can be selectively subjected to UV light and then developed to leave behind an image that will serve as a mask for forming particular patterns of photoresist material atop the silicon dioxide. Once a particular pattern of photoresist is formed atop the silicon dioxide of a wafer, portions of the wafer topped by silicon dioxide but not topped by photoresist may then be etched away from the wafer surface.

Etching is a common procedure employed in manufacture of silicon integrated circuit devices. In general terms, etching is a process by which portions of a workpiece may be selectively removed from the workpiece. The etch process yields a layer on the wafer surface having a desired geographical arrangement, for further processing. After the etch, the photoresist is removed by a subsequent processing step, leaving the silicon wafer topped only by select configurations of silicon dioxide.

The silicon dioxide/photoresist/etch method, generally described above, is extremely involved and requires careful processing steps to ensure accurate device patterning and proper device performance. One of the more important processing steps for the manufacture of silicon wafers may involve exposing the photoresist using deep ultra-violet (DUV) light (about 248 nm range). Photoresists responsive to this level of exposure are referred to as DUV resists.

Many commercially-available DUV resists rely on chemically-amplified resist chemistry. In this approach, DUV exposure causes a component known as a photoacid generator (PAG) to decompose to an acidic species. For positive DUV resists, post-exposure baking (PEB) catalyzes the acid to react to the surrounding polymer which converts the surrounding polymer from base insoluble to soluble. One potential problem with positive chemically-amplified DUV resists is that amines in the surrounding air can be absorbed onto the surface of the resist and neutralize the acid at the surface. When this occurs, the resist at the surface remains insoluble to base even though the underlying resist is soluble. For effective post-PEB development, the entire resist in the exposed areas should be soluble.

The progression leading to this contamination is illustrated in FIGS. 1a through 1d. In FIGS. 1a and 1b, the illustrated structure is shown after having been exposed to DUV light. The DUV exposure causes unmasked portions 30 of the photoresist to decompose to the acidic species $NHR_2$. As shown in FIGS. 1c and 1d, the subsequent baking of the exposed resist converts the surrounding polymer from base insoluble to soluble. The absorption of amines onto the surface of the resist is shown as the bridging layer 20, shown in the form of "T-topping" in FIG. 1d. The desired situation in which the photoresist results in no contamination, is shown FIG. 1e.

The typical chemically-amplified resist process overcomes this contamination problem through the use of additional equipment and steps to filter the environment before and while processing the wafers. While this approach is adequate for many applications, there have been pressures to reduce both manufacturing steps and costs, such as the steps and costs associated with environment filtering. In other more-sensitive applications, there is a need to further reduce levels of contamination, for example, by taking steps in addition to conventional environment filtering.

SUMMARY OF THE INVENTION

Generally, the present invention relates to a semiconductor device manufactured using an ashing process in connection with use of a photoresist to eliminate the adverse effects of contaminants such as amine airborne contamination.

Consistent with the present invention, a semiconductor device is formed as part of a wafer. A photoresist is formed over the wafer. The resist-treated wafer is exposed and then baked. Subsequently, the wafer is plasma-treated with an ash to remove the surface layer contaminants, such as amine-contaminants. After ashing, the wafer is developed using conventional processing.

A more particular implementation, consistent with the above-characterized implementation, employs a DUV-type photoresist that is exposed to DUV light, and the ash is applied using a downstream microwave ashing technique.

Other aspects of the present invention are directed to a semiconductor device and a method of manufacturing, each using an ashing method relating to the above process.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
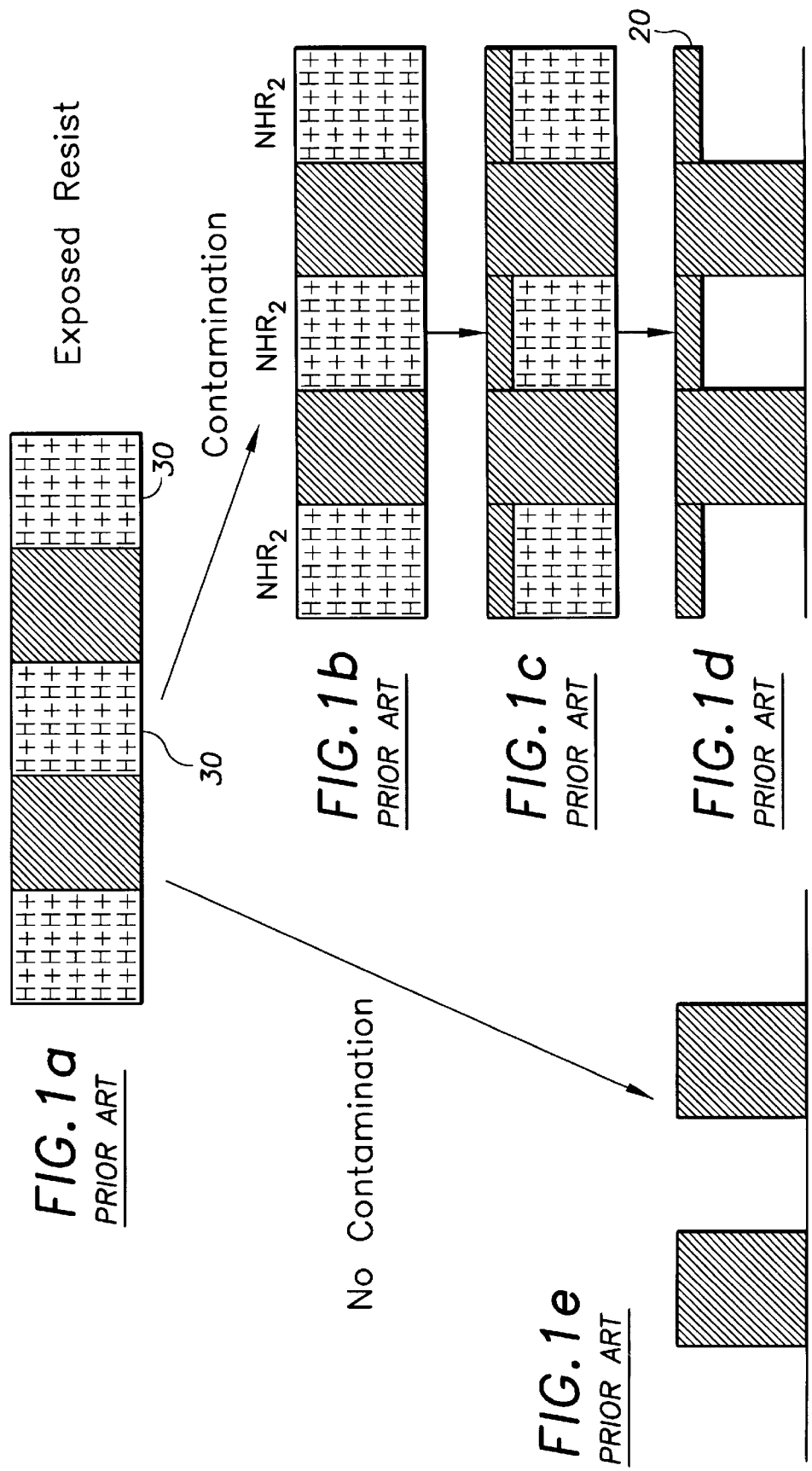
FIGS. 1a through 1e illustrate various cross-sectional views of a resist on a wafer during the manufacture of a semiconductor device, in various stages of development, as is conventionally understood in the art.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EXAMPLE EMBODIMENTS

The present invention is believed to be generally applicable to semiconductor devices that are manufactured using DUV photoresists, and particularly those DUV photoresists that rely on chemically-amplified resist chemistry and that are susceptible to amine airborne contamination. The invention has been found to be particularly advantageous in application environments where it is desirable to reduce or remove the need for environment filtering equipment. While the present invention is not so limited, an appreciation of various aspects of the invention is best gained through a discussion of various application examples of photolithography processes used to form such semiconductor devices.

As discussed at the outset hereof, photolithography involves use of a photoresist material, such as a photosensitive polymer, layered atop a somewhat uniform silicon dioxide layer on a wafer surface. A mask having a desired design of clear and opaque areas may then be positioned atop the photoresist layer. A DUV photoresist will selectively respond to DUV light. As a result of this selective response characteristic of photoresist, the photoresist can be selectively subjected to UV light and then developed to leave behind an image that will serve as a mask for forming particular patterns of photoresist material atop the silicon dioxide. Once a particular pattern of photoresist is formed atop the silicon dioxide of a wafer, portions of the wafer topped by silicon dioxide but not topped by photoresist may then be etched away from the wafer surface. After such etching, the photoresist is typically removed for subsequent processing of the semiconductor device.

Figure 2:
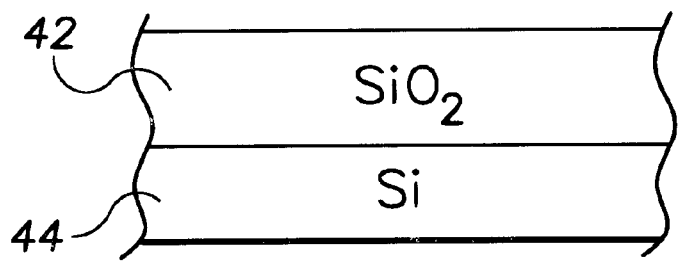
FIGS. 2 and 3 illustrate a semiconductor device, at two different early stages of development, according to an example embodiment of the present invention.

Turning now to FIG. 2, a cross-sectional view of a semiconductor device is shown at an early stage of manufacture. A layer 42 of silicon dioxide ($SiO_2$) is shown therein grown upon the surface of a wafer 44. In one particular example application, the $SiO_2$ serves as an insulative material between other semiconducting layers to be developed, and the $SiO_2$ is formed on the wafer surface in uniform layers or in particular patterns using photolithography.

Figure 3:
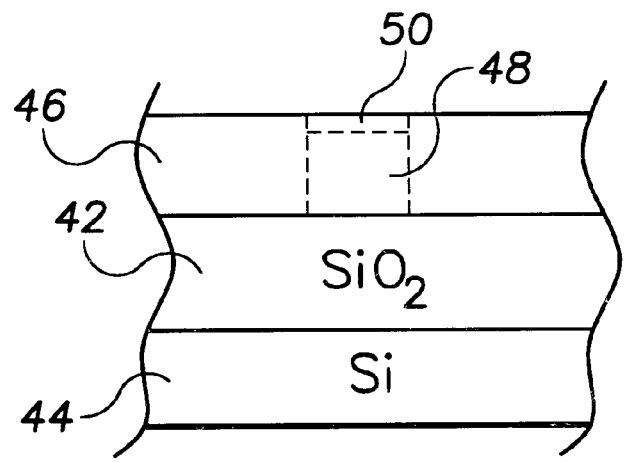

In FIG. 2, a photoresist material 46, such as UV5 DUV resist, is shown formed over the $SiO_2$ layer 42. In an example application, portions of the wafer 44 topped by silicon dioxide but not topped by the photoresist material 46 are etched away from the wafer surface to provide a patterned contact region (not shown). The vertically-oriented dotted lines shown in the photoresist material 46 of FIG. 3 indicate a portion 48 of the photoresist material 46 to be removed, for subsequent patterning of the photoresist material 46. The horizontally-oriented dotted line shown in the photoresist material 46 indicates the portion 50 of the photoresist material that is susceptible to forming an amine contamination layer, as discussed in connection with FIGS. 1a through 1e.

According to an example embodiment of the present invention, FIGS. 4a through 4f show various cross-sectional views of a resist on a wafer during a semiconductor manufacturing process in which ashing is used prior to development of the semiconductor device. The ashing step is performed to remove or eliminate the adverse effects of the surface amine contamination layer as discussed above in connection with FIGS. 1d and 3.

Figure 4A:
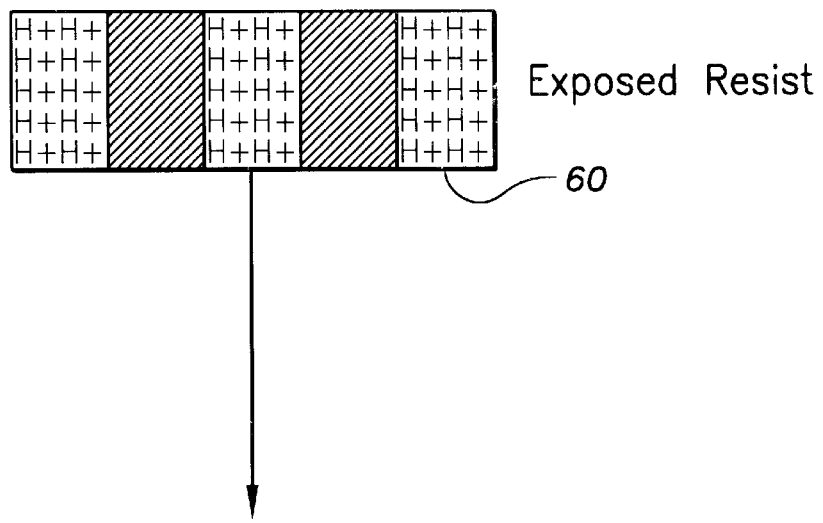
FIGS. 4a through 4f illustrate various cross-sectional views of a resist on a wafer during the manufacture of a semiconductor device, in various stages of development, according to an example embodiment of the present invention.
Figure 4B:
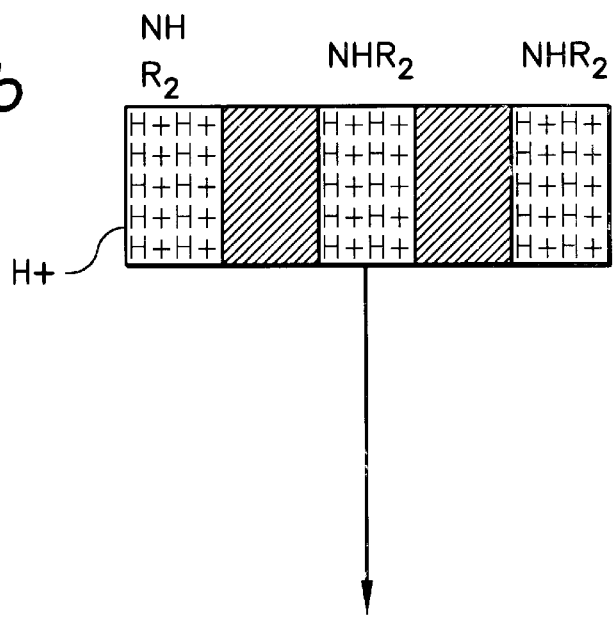
Figure 4C:
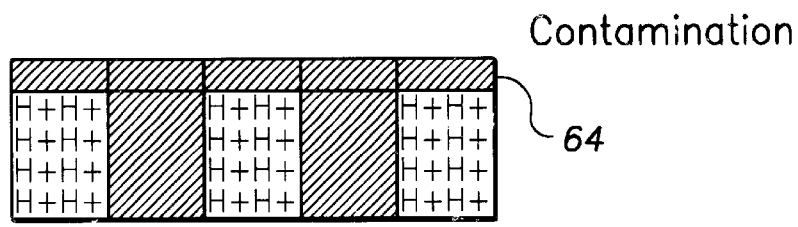
Figure 4D:
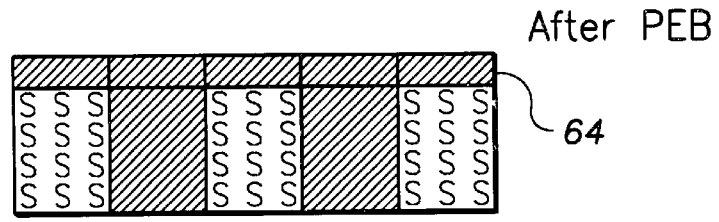

In FIG. 4a, the semiconductor structure is shown after having been exposed to DUV light. The DUV exposure causes unmasked portions 60 of the photoresist to decompose to a free acidic species, as indicated by the connotation "H+". As indicated by FIGS. 4b and 4c, during the post-exposure baking of the exposed resist, the acid catalyzes a reaction that converts the surrounding polymer from base insoluble to soluble. In FIG. 4c, a surface amine contamination layer 64 is shown along the upper portion of the resist. FIG. 4d illustrates the photoresist, after post-exposure baking, being converted to a base soluble resist ("S"), with the surface amine contamination layer 64 also shown along the upper portion of the resist.

Figure 4E:
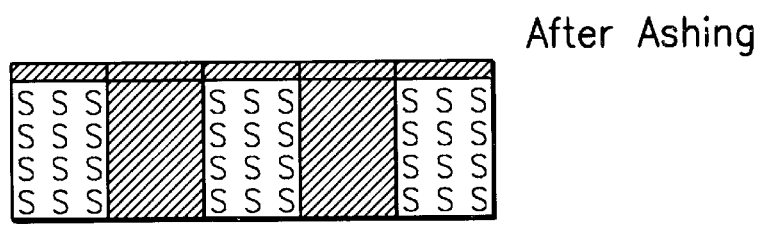

FIG. 4e illustrates the same structure, however, with the surface amine contamination layer 64 removed by plasma-treatment with an ash. As illustrated and in accordance with the present invention, the ashing step removes insoluble amine-related resist without adversely affecting underlying resist.

Figure 4F:
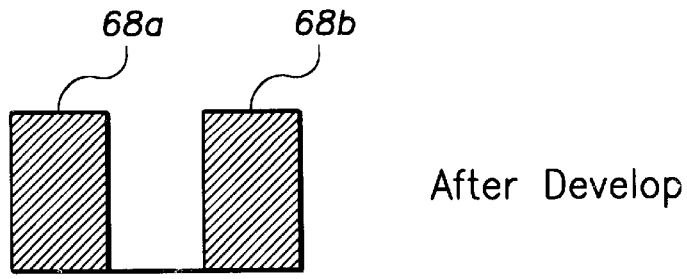

FIG. 4f shows the patterned resist after conventional development. In one example embodiment, the spacing between the patterned resist portions 68a and 68b is less than 0.2 micron.

According to a specific example implementation of the above-described method, the resist is implemented using a UV5 DUV-type resist, exposed on a conventional DUV excimer laser stepper or mercury-arc lamp source, and subjected to conventional post-exposure baking. In a particular processing run, after being archived for four days, the wafer is subjected to a downstream microwave ashing technique in which roughly 300 Angstroms of contaminated photoresist are successfully removed.

The present invention should not be considered limited to the particular examples described above, but rather should be understood to cover all aspects of the invention as fairly set out in the attached claims. Various modifications, equivalent processes, as well as numerous structures to which the present invention may be applicable. For example, acid-catalyzed resists are not limited to DUV or to 248 nm wavelength applications. Further, chemically-amplified resists can also be sensitive to 193 nm and 365 nm wavelengths. The present invention is also applicable to other resist chemistries that are sensitive to environment-induced contamination, and removal of surface layers by this inventive ashing process is not limited to chemically- amplified resist chemistries. Such alternative approaches will be readily apparent to those of skill in the art upon review of the present specification. The claims are intended to cover such alternative approaches as well.

What is claimed is:

1. For use in the manufacture of a semiconductor device, a method for inhibiting surface contamination, comprising:

providing a wafer having a wafer surface and a photoresist thereover;

exposing the photoresist including subjecting the photoresist to DUV light;

baking the wafer; and subsequently, plasma-treating the wafer using ashing process to remove contamination at a top surface of the resist while retaining and subsequently patterning a remaining portion of the photoresist for development.

2. A method for inhibiting surface contamination, according to claim 1, wherein the photoresist relies on chemically-amplified resist chemistry.

3. A method for inhibiting surface contamination, according to claim 1, wherein plasma-treating the wafer using an elevated temperature.

4. A method for inhibiting surface contamination, according to claim 3, wherein the elevated temperature is not greater than about 200 degrees C.

5. A method for inhibiting surface contamination, according to claim 1, wherein plasma-treating the wafer includes removing surface skin containing insoluble amine-related resist without adversely affecting underlying resist.

6. A method for inhibiting surface contamination, according to claim 1, wherein providing a wafer having a wafer surface and a photoresist thereover includes coating the wafer with a DUV photoresist.

* * * * *